(12) United States Patent
Ramadoss et al.

(10) Patent No.: US 8,546,921 B2
(45) Date of Patent: Oct. 1, 2013

(54) HYBRID MULTILAYER SUBSTRATE

(75) Inventors: Vivek Ramadoss, San Diego, CA (US); Gopal C. Jha, San Diego, CA (US); Christopher J. Healy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 81 days.

(21) Appl. No.: 12/862,068

(22) Filed: Aug. 24, 2010

(65) Prior Publication Data

US 2012/0049333 A1 Mar. 1, 2012

(51) Int. Cl.
*H01L 23/552* (2006.01)

(52) U.S. Cl.
USPC ........... 257/659; 257/700; 257/723; 438/107; 438/108

(58) Field of Classification Search
USPC .................. 257/723, 700, 659; 438/107, 108
See application file for complete search history.

(56) References Cited

U.S. PATENT DOCUMENTS

| 5,821,604 | A | 10/1998 | Egawa |
| 6,683,795 | B1 | 1/2004 | Yoo |
| 2003/0042582 | A1* | 3/2003 | Crane et al. .................... 257/666 |
| 2003/0137046 | A1* | 7/2003 | Kageyama ..................... 257/704 |
| 2005/0151240 | A1* | 7/2005 | Takeda et al. ................. 257/700 |
| 2008/0136021 | A1 | 6/2008 | Yang |
| 2008/0179717 | A1 | 7/2008 | Wu |
| 2009/0200648 | A1 | 8/2009 | Graves, Jr. |
| 2009/0206455 | A1 | 8/2009 | Harper et al. |
| 2009/0315156 | A1 | 12/2009 | Harper |
| 2010/0244208 | A1* | 9/2010 | Pagaila et al. ................. 257/659 |
| 2011/0068459 | A1* | 3/2011 | Pagaila et al. ................. 257/698 |
| 2011/0089553 | A1* | 4/2011 | Kim et al. ...................... 257/686 |

FOREIGN PATENT DOCUMENTS

EP 1381258 A1 1/2004

OTHER PUBLICATIONS

International Search Report and Written Opinion—PCT/US2011/048887-ISA/EPO—Jan. 19, 2012.

\* cited by examiner

*Primary Examiner* — Phat X Cao
(74) *Attorney, Agent, or Firm* — Michelle Gallardo

(57) ABSTRACT

A hybrid multilayer substrate in an electronic package. The substrate includes a first portion having m layers and a second portion having n layers such that m is less than n. The first portion has a first height and the second portion has a second height. The first height is different than the second height. In another embodiment, a surface is formed between the first portion and the second portion, and a shielding material can be applied to the surface. In a different embodiment, the hybrid multilayer substrate is manufactured for shielding a first die from a second die.

17 Claims, 4 Drawing Sheets

HYBRID MULTILAYER SUBSTRATE

FIELD OF DISCLOSURE

This disclosure relates generally to electronic packaging, and in particular to a hybrid multilayer substrate in an electronic package.

BACKGROUND

In electronic packaging, one or more dies in a package can be negatively impacted by electromagnetic (EM) or radio-frequency (RF) interference. In multi-chip packages, it is difficult to completely isolate a die from being affected by the interference. It is also difficult to incorporate a digital device and an RF device, for example, in the same package because of potential interference between the devices.

A substrate is used to mechanically support and electrically connect electronic components and includes layers with both conducting and insulating materials to create conductive pathways, tracks or signal traces for the electrical components to connect to each other and/or to external connections. Conducting layers are typically made of thin copper foil while insulating layers are typically a dielectric material and are laminated together with epoxy resin.

A die used for digital applications may need to be attached to a substrate with more layers than a die used for RF applications. This may be because the die used for digital applications requires significantly more input and output (I/O) connections. On the other hand, it may be desirable that the die used for RF applications have shorter signal paths to decrease parasitic and inductance effects. Thus, the RF die may be attached to a substrate with fewer layers thereby having shorter signal paths. Conventional substrates, however, are made with the same number of layers throughout and therefore conventional packages have trouble adequately shielding or reducing EM and RF interference between adjacent dies.

Therefore, it would be desirable to develop an electronic package that can shield RF and EM interference while also meeting the layer requirements for both digital and RF die.

SUMMARY

For a more complete understanding of the present disclosure, reference is now made to the following detailed description and the accompanying drawings. In an exemplary embodiment, an electronic package is provided with a hybrid multilayer substrate. The substrate has a first portion with m layers and a second portion with n layers such that m is less than n. In addition, the first portion has a first height and the second portion has a second height. The first height is different than the second height. Also, a substantially vertical surface can be formed between the first portion and the second portion. A shield material can be deposited on the surface. The shield material can be a metal or polymer.

In one form of the embodiment, a first die is coupled to the substrate. The first die can be coupled to the first portion or second portion of the substrate. When coupled to the first portion, a second shield material is deposited on a top surface of the first die. The second shield material can include a metal or polymer. The first shield material and the second shield material can be the same and form a shield that substantially surrounds the first die. In another form of this embodiment, a second die is coupled to the substrate. The second die can be coupled to the second portion of the substrate.

In another embodiment, a hybrid multilayer substrate is provided. The substrate includes a first portion having m layers and a second portion having n layers such that m is less than n. The first portion has a first height and the second portion has a second height such that the first height is different than the second height. The substrate can further include a surface formed between the first portion and the second portion. The surface can be substantially vertical and include a first shield material applied thereto. The first shield material can be a metal or polymer.

In a different embodiment, an electronic package includes a hybrid multilayer substrate. The hybrid multilayer substrate has a first portion with m layers and a second portion with n layers such that m is less than n. The package also includes a surface formed between the first portion and the second portion. A first die is coupled to the substrate and a first shielding material is disposed on the surface. The surface can be substantially vertical.

In one form of this embodiment, a second shielding material is disposed on a top surface of the first die. The first shielding material or the second shielding material can include a metal or polymer. In addition, the first shielding material and the second shielding material form a shield that substantially surrounds the first die.

In another form thereof, the first die is coupled to the first portion. The package can further include a second die coupled to the substrate. The second die can be coupled to the second portion. In this embodiment, the first portion has a first height and the second portion has a second height whereby the first height is different than the second height.

In another exemplary embodiment, a method of fabricating an electronic substrate is provided. The method includes making a first portion having m layers and a second portion having n layers such that m is less than n. A surface is formed between the first portion and the second portion such that the first portion has a first height and the second portion has a second height. The first height is different than the second height. The method can further include depositing a first shield material on the surface. The first shield material can include a metal or polymer. In addition, the surface can be substantially vertical.

In another embodiment of the present invention, a method of fabricating an electronic package includes making a hybrid multilayer substrate. The substrate can have a first portion with m layers and a second portion with n layers such that m is less than n. The method also includes forming a surface between the first portion and the second portion and coupling a first die to the substrate. A first shielding material is deposited on the surface. The surface can be substantially vertical.

In one form of this embodiment, the method can include depositing a second shielding material on a top surface of the first die. The first shielding material or the second shielding material can include a metal or polymer. In addition, the first die can be coupled to the first portion.

In another form thereof, the method can include coupling a second die to the substrate. The second die can be coupled to the second portion. The method can also include shielding the first die from the second die. In addition, the first portion can have a first height and the second portion can have a different height.

The above-described embodiments are advantageous for coupling an RF device and a digital device to the same substrate. For instance, a first die can be used for RF applications and is coupled to a first portion of the substrate having fewer layers. On the other hand, a second die can be used for digital applications and is coupled to the second portion of the substrate having additional layers. Since the second die may require more I/O connections, the second portion of the substrate can meet the desired need. Also, since the first die may require fewer I/O connections but is more sensitive to parasitic influences, the first portion of the substrate can meet the desired need.

Also, an electronic package having a hybrid multilayer substrate can include shielding so that many different dies can be coupled thereto. Each die can be shielded from the others by coupling each die to various portions of the substrate. In conventional packages, these dies may have to be assembled to different packages, whereas the above-described embodiments allow for the dies to be coupled to the same package.

Thus, the above-described embodiments can achieve desired functionality requirements in the same package. In addition, the surface area or footprint of the package is not increased therefore allowing the substrate to be assembled in many, if not all, desired applications.

DETAILED DESCRIPTION

Figure 1:
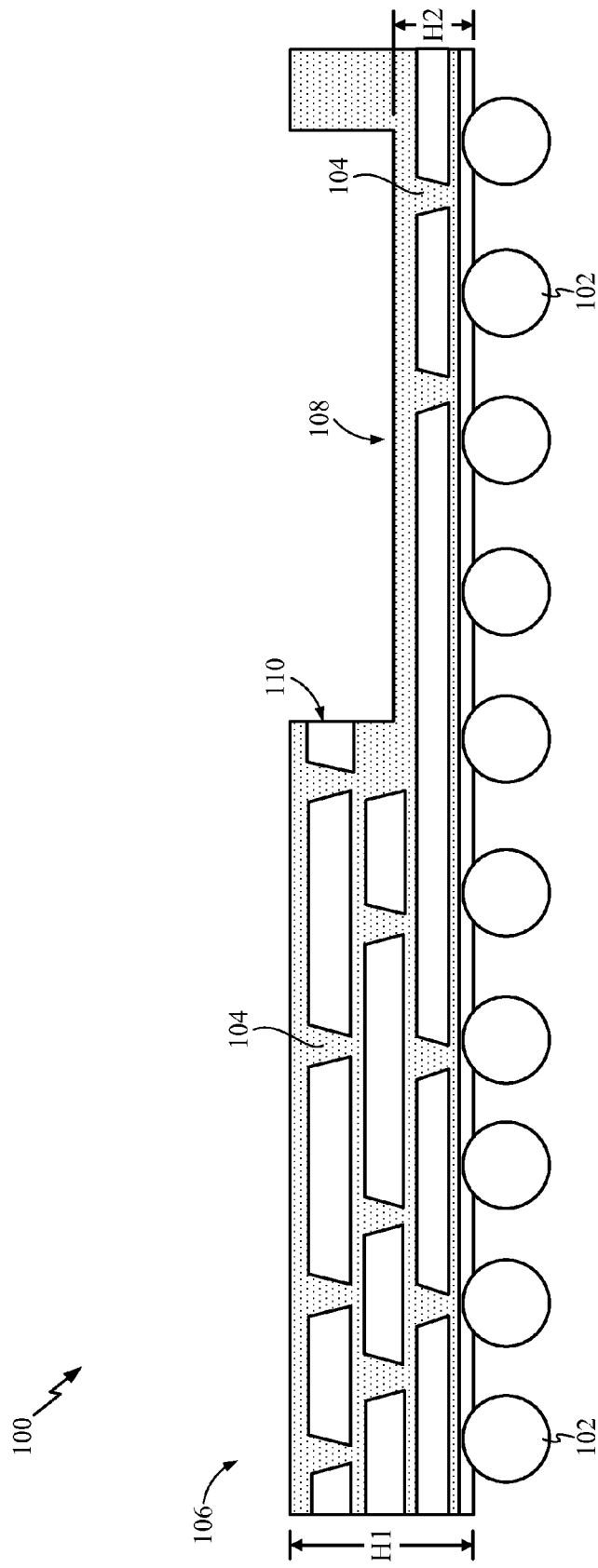
FIG. 1 is a cross-sectional view of a hybrid multilayer substrate.

Referring to FIG. 1, an exemplary embodiment is provided of a hybrid multilayer substrate 100. The substrate 100 can be fabricated from any suitable material, including a silicon wafer or other substrate material (e.g., glass). The substrate 100 can include a plurality of bumps 102 for coupling to a device such as a printed circuit board (PCB) or an electronic package. In addition, the substrate 100 can include a plurality of traces 104 defined therein.

The hybrid multilayer substrate 100 further includes a first portion 106 and a second portion 108. The first portion 106 has a first height H1 and the second portion 108 has a second height H2. In this embodiment, the first height H1 is greater than the second height H2. A surface 110 is defined between the first portion 106 and the second portion 108. The surface 110 can be substantially vertical, as shown in the embodiment of FIG. 1, or the surface 110 can be formed at any desired angle to transition between the two portions of the substrate 100.

In addition, the first portion 106 of the substrate 100 can have more layers than the second portion 108. In one non-limiting example, the first portion 106 can have four or six layers and the second portion 108 can have two layers. The additional layers in the first portion 106 allow for a larger quantity of input/output (I/O) connections and signal traces 104. This can be important for coupling a die used for digital applications to the substrate 100. For example, a digital device can require hundreds of I/O connections or more, and a two layer substrate may be unable to provide for all of these connections. The second portion 108 can have fewer layers than the first portion 106 and thus a signal path therethrough can be made shorter. This can be advantageous for coupling a different RF device to the second portion 108 of the substrate 100, because the shorter signal path is impacted less by parasitic and inductance effects. An RF device may require fewer I/O connections and therefore a two layer substrate may be sufficient Thus, in the embodiment of FIG. 1, the first portion 106 of the hybrid multilayer substrate 100 is able to meet the connection requirements for a digital device while the second portion 108 is able to meet the requirements for an RF device allowing both the digital and RF applications to be performed using the same substrate 100. In addition, the surface area of the substrate 100 is not increased and multiple substrates are not required, making it easier for the substrate 100 to meet dimensional thresholds set forth by the customer. Other embodiments can include more than two portions having different heights. For example, the hybrid multilayer substrate 100 can be manufactured to include a plurality of portions of which each has a defined height. One or more of the plurality of portions in the substrate 100 can be manufactured with the same or different height as the other portions. Thus, the hybrid multilayer substrate 100 can be fabricated to meet any desirable need.

Figure 2:
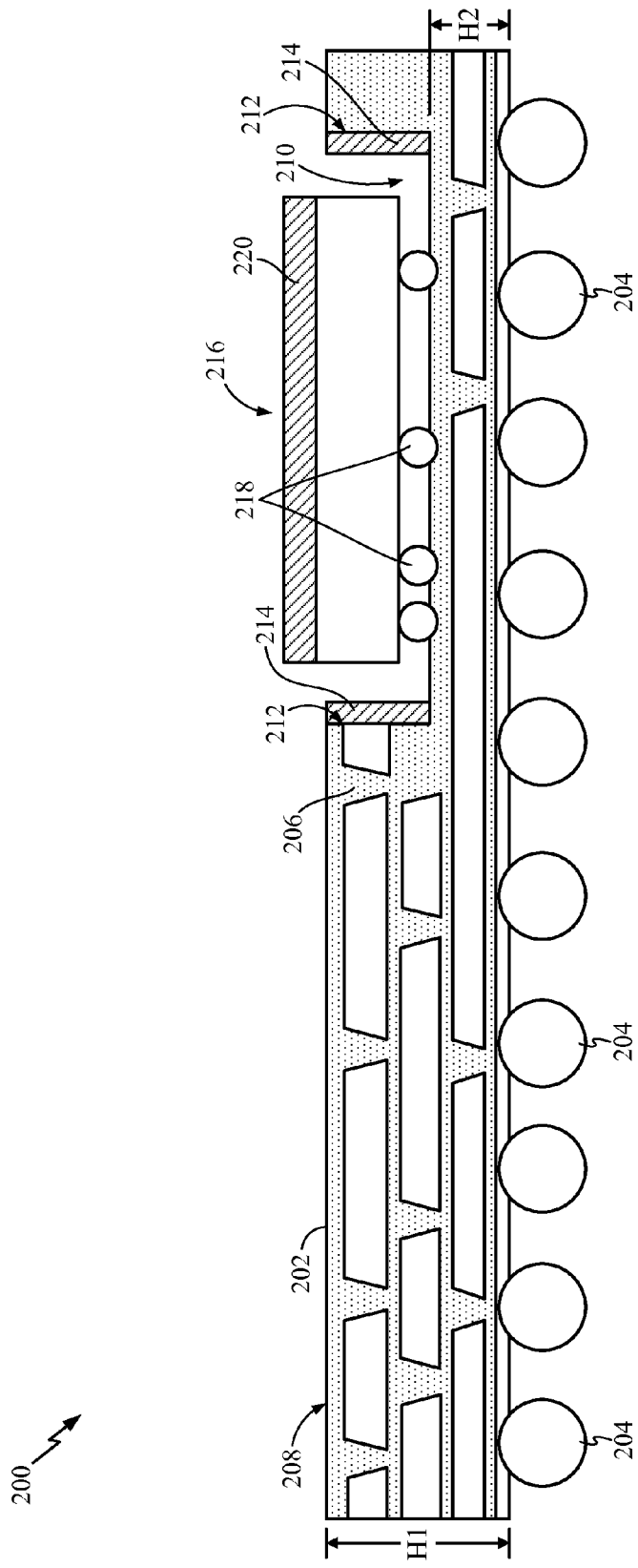
FIG. 2 is a cross-sectional view of an electronic package with the substrate of FIG. 1 and a die coupled thereto.

Referring to FIG. 2, an electronic package 200 is shown. The electronic package 200 includes a hybrid multilayer substrate 202 similar to the one shown in FIG. 1. The substrate 202 can be coupled to a PCB or another package by a plurality of bumps 204. Also, a plurality of conductive traces 206 are formed in the substrate 202. The hybrid multilayer substrate 202 can be manufactured from silicon, glass, or any other known substrate material.

Similar to the substrate 100 of FIG. 1, the hybrid multilayer substrate 202 can include a first portion 208 and a second portion 210. The first portion 208 can have a first height H1 and the second portion 210 can have a second height H2. In this embodiment, the first height H1 is approximately twice the second height H2. In a different embodiment, the first height H1 can be substantially the same as the second height H2.

The first portion 208 and the second portion 210 of the substrate 202 can define a surface 212 therebetween. The surface 212 can be substantially vertical or have a different transition angle between the two heights. In the embodiment of FIG. 2, a shield material 214 substantially covers the surface 212. The shield material 214 can be a metal or polymer. If the shield material 214 is metallic, the method of applying the metal to the surface 212 can be by a plating process or other known process. If the shield material 214 is a polymer, the polymer can be applied to the surface 212 by polymer printing or other known process.

A die 216 can be coupled to the second portion 210 of the substrate 202 by a plurality of microbumps 218. A shielding layer 220 can be applied to a top surface of the die 216 as shown in FIG. 2. The shield material 214 and shield layer 220 can effectively shield signal paths within the package 200 from EM and/or RF interference from the die 216. Also, the shield material 214 and shield layer 220 can shield the die 216 from EM and/or RF interference from other components in the package 200. This is advantageous over conventional packages because the shielding is achieved within the same package.

Figure 3:
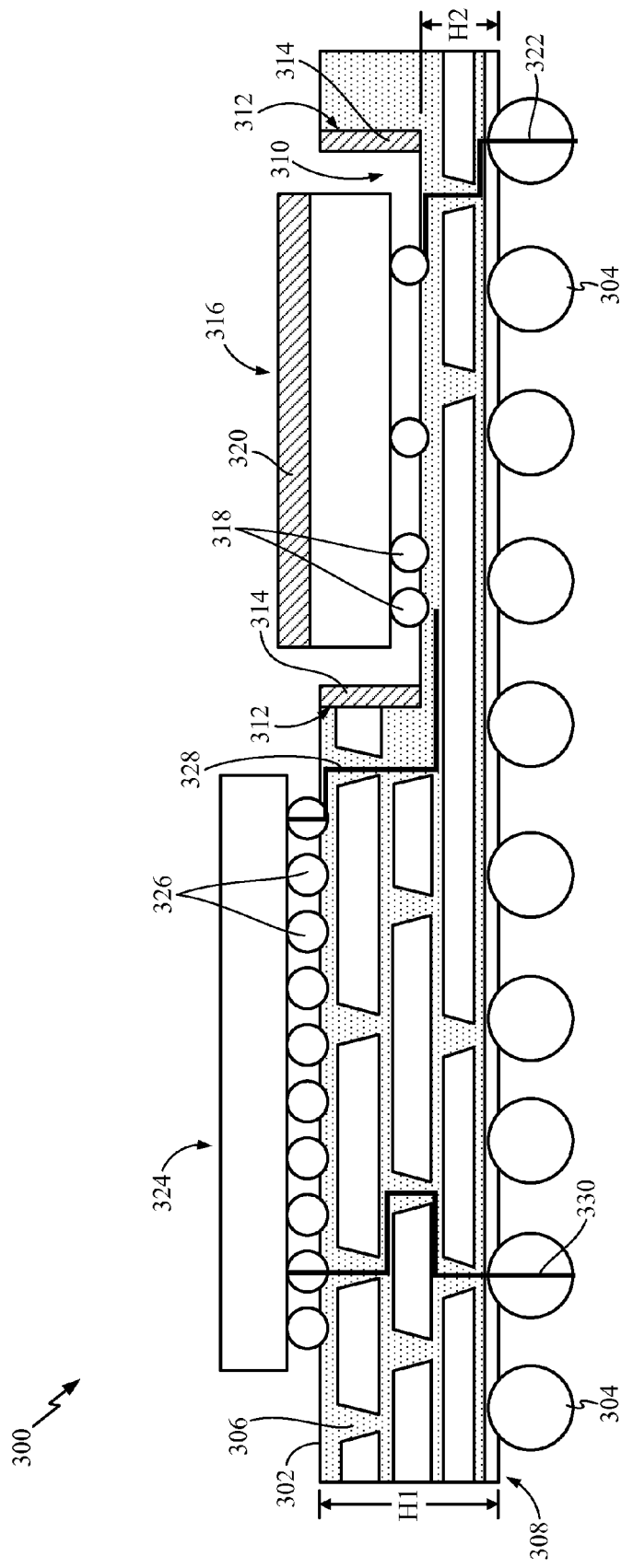
FIG. 3 is a cross-sectional view of another electronic package with the substrate of FIG. 1 and a plurality of dies coupled thereto.

In FIG. 3, another exemplary embodiment of an electronic package 300 is shown. In this package 300, a hybrid multilayer substrate 302 includes a plurality of bumps 304 for coupling to a PCB or another package. The substrate 302 further includes a plurality of conductive traces 306. The hybrid multilayer substrate 302 can be formed of silicon, glass, or other known substrate material.

The substrate 302 can also include a plurality of different portions. In the embodiment of FIG. 3, for example, a first portion 308 and a second portion 310 are shown. The substrate 302, however, can include additional portions to meet a desired need. In the present embodiment, the first portion 308 has a first height H1 and the second portion 310 has a second height H2. Here, the first height H1 is greater than the second height H2. In addition, the first portion 308 can include more layers than the second portion 310 and thereby support additional I/O connections. As described above, this can be advantageous for coupling digital and RF devices to the same package substrate and thereby provide greater functionality to the end user. In other embodiments, the first portion 308 and second portion 310 can include any number of layers to meet the functionality requirements for the package.

The first portion 308 and the second portion 310 of the substrate 302 can define a surface 312 therebetween. The surface 312 can be substantially vertical or defined at any desirable angle to transition between the two heights. In FIG. 3, a shield material 314 is applied to the surface 312. The shield material 314 can be a metal, polymer, or other appropriate material to reduce or eliminate EM and/or RF interference. If the shield material 314 is metallic, the method of applying the metal to the surface 312 can be by a plating process or other known process. If the shield material 314 is a polymer, the polymer can be applied to the surface 312 by polymer printing or other known process.

The embodiment of FIG. 3 shows a first die 316 coupled to the second portion 310 of the hybrid multilayer substrate 302 by a plurality of microbumps 318. The plurality of microbumps 318 can electrically couple the first die 316 to the substrate 302 such that one or more signal paths 322 are formed therein. A shield layer 320 can also be formed to substantially cover a top surface of the first die 316. The combination of the shield material 314 disposed on the surface 312 of the substrate 302 and the shield layer 320 effectively shield the first die 316 from other dies in the package 300.

For example, in the embodiment of FIG. 3, a second die 324 can be coupled to the first portion 308 of the hybrid multilayer substrate 302 by a plurality of microbumps 326. The plurality of microbumps 326 electrically couples the second die 324 to the substrate 302 such that multiple signal paths are formed. For instance, the first die 316 and the second die 324 can be electrically coupled by one or more signal paths 328. A different signal path 330, for example, can electrically couple the second die 324 to a PCB or another package.

In this electronic package 300, the first die 316 and second die 324 are electrically coupled by the signal path 328. However, the shield material 314 and shield layer 320 can shield the first die 316 and the second die 324 from one another. Thus, the first die 316 can be used for RF applications and the second die 324 can be used for digital applications, and the interference generated by both dies is effectively shielded by the shield material 314 and shield layer 320. As such, shielding is achieved in the same package between adjacent dies.

Figure 4:
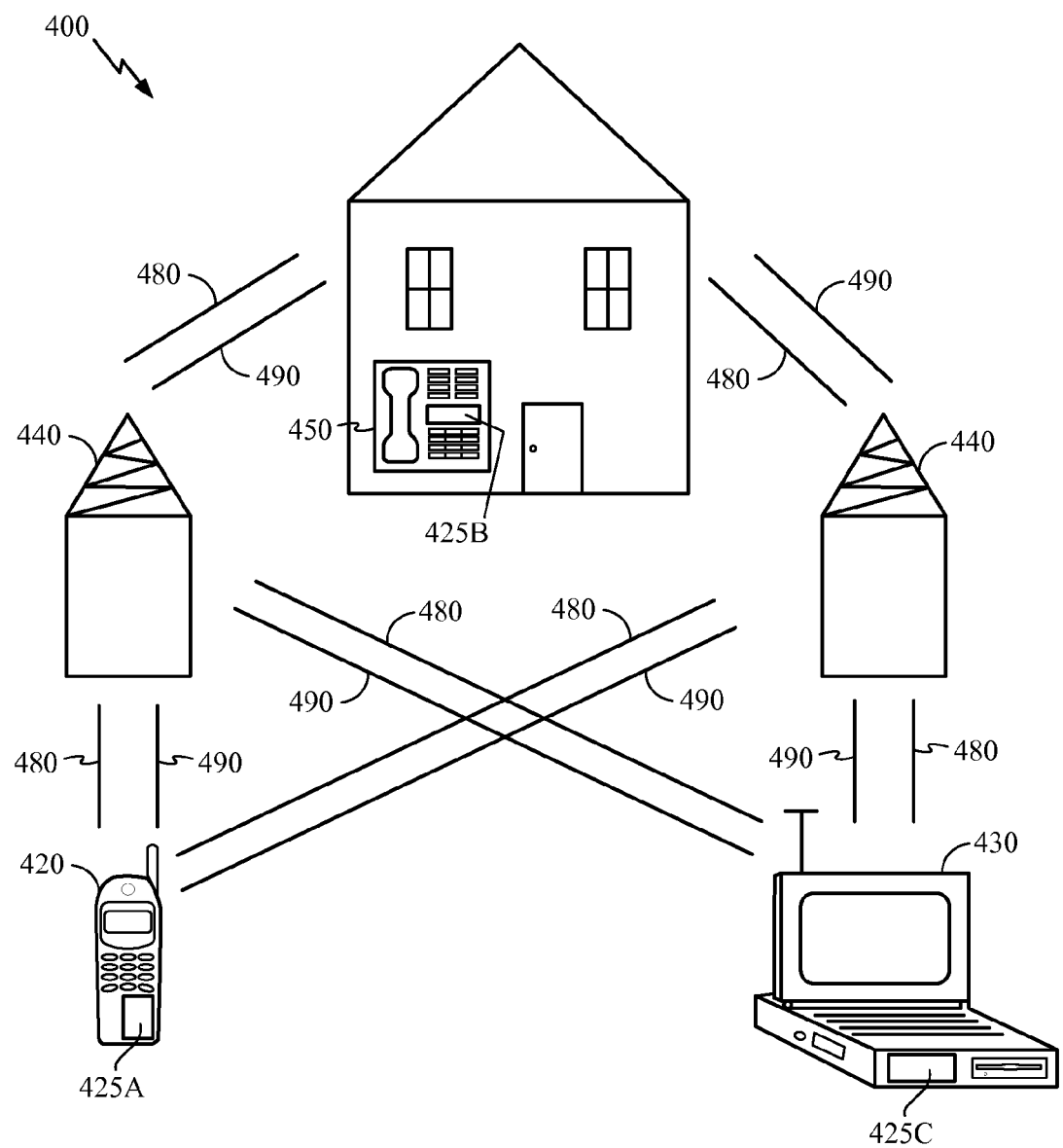
FIG. 4 is a block diagram showing an exemplary wireless communication system in which it may be advantageous to use a package having a hybrid multilayer substrate with improved shielding.

FIG. 4 shows an exemplary wireless communication system 400 in which an embodiment of an electronic package having a hybrid multilayer substrate with improved shielding may be advantageously employed. For purposes of illustration, FIG. 4 shows three remote units 420, 430, and 450 and two base stations 440. It should be recognized that typical wireless communication systems may have many more remote units and base stations. Any of remote units 420, 430, and 450, as well as the base stations 440, may include an electronic package having a hybrid multilayer substrate with improved shielding such as disclosed herein. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 4 illustrates certain exemplary remote units that may include an electronic package having a hybrid multilayer substrate with improved shielding as disclosed herein, the invention is not limited to these exemplary illustrated units. Embodiments may be suitably employed in any electronic device in which an electronic package having a hybrid multilayer substrate with improved shielding is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electronic package, comprising:
    a substrate having a first portion with m layers and a second portion with n layers, m being less than n, wherein the first portion has a first height and the second portion has a second height, the first height being different than the second height;
    a first die coupled to and disposed on a surface of the first portion of the substrate at the first height;
    a second die coupled to and disposed on a surface of the second portion of the substrate at the second height, the second die disposed in a non-overlapping configuration with respect to the first die;
    a first shield material directly on a surface of the first die opposite the surface of the first portion of the substrate, in which the first shield material is conductive; and
    a second shield material on a substantially perpendicular surface formed between the first portion and the second portion.

2. The package of claim 1, wherein the second shield material comprises a metal or polymer.

3. The package of claim 1, wherein the first shield material and the second shield material are the same.

4. The package of claim 1, wherein the first shield material and second shield material form a shield, the shield substantially surrounding the first die.

5. The package of claim 1 incorporated into a music player, a video player, an entertainment unit, a navigation device, a communications device, a personal digital assistant (PDA), a fixed location data unit, and/or a computer.

6. A substrate, comprising:
    a first portion having m layers and a second portion having n layers, m being less than n, wherein the first portion has a first height and the second portion has a second height, the first height being different than the second height;
    a first die coupled to and disposed on a surface of the first portion of the substrate at the first height;
    a second die coupled to and disposed on a surface of the second portion of the substrate at the second height, the second die disposed in a non-overlapping configuration with respect to the first die;

a first shield material directly on a surface of the first die opposite the surface of the first portion of the substrate, in which the first shield material is conductive; and a second shield material on a substantially perpendicular surface formed between the first portion and the second portion.

7. The substrate of claim 6 incorporated into a music player, a video player, an entertainment unit, a navigation device, a communications device, a personal digital assistant (PDA), a fixed location data unit, and/or a computer.

8. An electronic package, comprising:
a hybrid multilayer substrate having a first portion with m layers and a second portion with n layers, m being less than n;
a substantially perpendicular surface formed between the first portion and the second portion;
a first die coupled to and disposed on a surface of the first portion of the substrate at a first height;
a second die coupled to and disposed on a surface of the second portion of the substrate at a second height, the second die disposed in a non-overlapping configuration with respect to the first die, the first height being different than the second height;
first means for shielding the first die and second die from one another, the first shielding means directly on a surface of the first die opposite the surface of the first portion of the substrate; and
second means for shielding the first die and the second die from one another, the second shielding means on the substantially perpendicular surface.

9. The package of claim 8, wherein the first means for shielding and the second means for shielding include a metal or polymer.

10. The package of claim 8, wherein the first means for shielding and the second means for shielding form a shield, the shield substantially surrounding the first die.

11. The package of claim 8, wherein the first portion has the first height and the second portion has the second height, the first height being less than the second height.

12. The package of claim 8 incorporated into a music player, a video player, an entertainment unit, a navigation device, a communications device, a personal digital assistant (PDA), a fixed location data unit, and/or a computer.

13. A method of fabricating an electronic substrate, comprising:
making a first portion having m layers and a second portion having n layers, m being less than n; and
forming a substantially perpendicular surface between the first portion and the second portion, wherein the first portion has a first height and the second portion has a second height, the first height being different than the second height;
placing a first die on a surface of the first portion of the substrate at the first height;
placing a second die on a surface of the second portion of the substrate at the second height, the second die disposed in a non-overlapping configuration with respect to the first die;
placing a first shield material directly on a surface of the first die opposite the surface of the first portion of the substrate, in which the first shield material is conductive; and
placing a second shield material on the substantially perpendicular surface.

14. The method of claim 13, wherein the second shield material comprises a metal or polymer.

15. The method of claim 13 incorporated into a music player, a video player, an entertainment unit, a navigation device, a communications device, a personal digital assistant (PDA), a fixed location data unit, and/or a computer.

16. A method of fabricating an electronic package, comprising:
making a hybrid multilayer substrate, the substrate having a first portion with m layers and a second portion with n layers, m being less than n;
forming a substantially perpendicular surface between the first portion and the second portion;
coupling and placing a first die on a surface of the first portion of the substrate at a first height;
coupling and placing a second die on a surface of the second portion of the substrate at a second height, the second die disposed in a non-overlapping configuration with respect to the first die, the first height being different than the second height;
shielding the first die and the second die from one another by a first shield material directly on a surface of the first die opposite the surface of the first portion of the substrate, in which the first shield material is conductive; and
shielding the first die and the second die from one another by a second shield material on the substantially perpendicular surface.

17. The method of claim 16 incorporated into a music player, a video player, an entertainment unit, a navigation device, a communications device, a personal digital assistant (PDA), a fixed location data unit, and/or a computer.

* * * * *